(12) United States Patent
Van Diepen

(10) Patent No.: US 9,504,360 B2
(45) Date of Patent: Nov. 29, 2016

(54) DISPENSER AND REFILL UNIT AND DISPENSING METHODS

(71) Applicant: Reckitt Benckiser LLC, Parsippany, NJ (US)

(72) Inventor: Jacobus Simon Petrus Van Diepen, Dongguan (CN)

(73) Assignee: Reckitt Benckiser LLC, Parsippany, NJ (US)

( * ) Notice: Subject to any disclaimer, the term of this patent is extended or adjusted under 35 U.S.C. 154(b) by 45 days.

(21) Appl. No.: 14/373,177

(22) PCT Filed: Feb. 6, 2013

(86) PCT No.: PCT/GB2013/050272
§ 371 (c)(1),
(2) Date: Jul. 18, 2014

(87) PCT Pub. No.: WO2013/121177
PCT Pub. Date: Aug. 22, 2013

(65) Prior Publication Data
US 2014/0353335 A1    Dec. 4, 2014

(30) Foreign Application Priority Data

Feb. 15, 2012    (GB) .................................. 1202578.9

(51) Int. Cl.
*A47K 5/12*    (2006.01)
*B65D 47/20*    (2006.01)
(Continued)

(52) U.S. Cl.
CPC ........... *A47K 5/1217* (2013.01); *A47K 5/1201* (2013.01); *B65D 47/2031* (2013.01);
(Continued)

(58) Field of Classification Search
CPC ............. A47K 5/1217; A47K 5/1201; B65D 51/165; B65D 2205/00; B65D 47/2031; Y10T 137/9029; Y10T 137/7897; Y10T 137/7895; F16K 17/085; F16K 17/087; F16K 15/145; H03K 17/945; B67D 3/0003; B67D 83/26; B67D 83/262
See application file for complete search history.

(56) References Cited

U.S. PATENT DOCUMENTS 4,736,871 A    4/1988 Luciani et al.
(Continued)

FOREIGN PATENT DOCUMENTS

WO    2009120318 A2    10/2009
WO    2009148345 A2    12/2009
(Continued)

OTHER PUBLICATIONS

International Search Report for PCT/GB2013/050272 dated Oct. 14, 2013.
(Continued)

*Primary Examiner* — Frederick C Nicolas
(74) *Attorney, Agent, or Firm* — Norris McLaughlin & Marcus PA

(57) ABSTRACT

A dispenser having a base unit with an actuation mechanism for dispensing liquid and a refill unit insertable into the base in an inverted configuration with its outlet lowermost to supply liquid to the base. The refill comprises an annular wall projecting into the base and defining an outlet from the refill. The annular wall is closable by a valve element. The base comprises a hollow spigot and an annular seal surrounding and spaced from the spigot whereby insertion of the refill into the base causes the spigot to enter the annular wall and lift the valve element from the annular wall to define a flow path from the refill to the spigot. The base also comprises a proximity sensor and an inclination sensor each of which may independently or jointly trigger the actuation mechanism causing the device to operate to deliver one or more doses of liquid from the dispenser.

9 Claims, 16 Drawing Sheets

(51) Int. Cl.
*H03K 17/945* (2006.01)
*F16K 17/08* (2006.01)
*B67D 3/00* (2006.01)
*B65D 83/26* (2006.01)
*F16K 15/14* (2006.01)

(52) U.S. Cl.
CPC ........... *B65D83/262* (2013.01); *B67D 3/0003* (2013.01); *F16K 15/145* (2013.01); *F16K 17/085* (2013.01); *F16K 17/087* (2013.01); *H03K 17/945* (2013.01); *Y10T 137/7895* (2015.04); *Y10T 137/9029* (2015.04)

(56) References Cited

U.S. PATENT DOCUMENTS

| | | | |
|---|---|---|---|
| 8,662,356 B2* | 3/2014 | Padain et al. | A47K 5/1217 222/183 |
| 8,881,957 B2* | 11/2014 | Zhou et al. | B65D 51/165 137/526 |
| 8,955,719 B2* | 2/2015 | Li | A47K 5/16 222/190 |
| 2012/0097711 A1* | 4/2012 | Xianzhi et al. | A47K 5/1217 222/325 |

FOREIGN PATENT DOCUMENTS

| | | |
|---|---|---|
| WO | 2010055309 A1 | 5/2010 |
| WO | 2010055314 A1 | 5/2010 |

OTHER PUBLICATIONS

Written Opinion of the International Searching Authority for PCT/GB2013/050272 dated Oct. 14, 2013.
GB Search Report for GB1202578.9 dated Jun. 18, 2012.
International Preliminary Report on Patentability and Written Opinion of the International Searching Authority for PCT/GB2013/050272 dated Aug. 19, 2014.

* cited by examiner

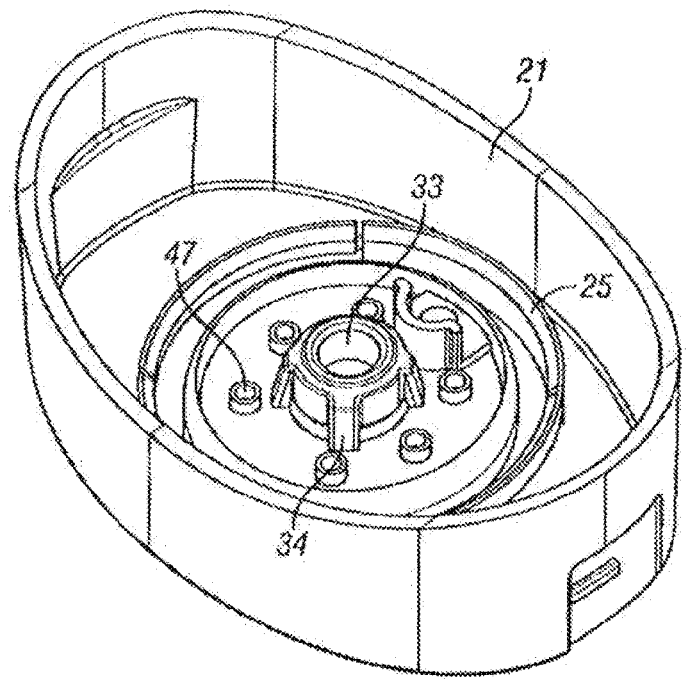
FIG. 12
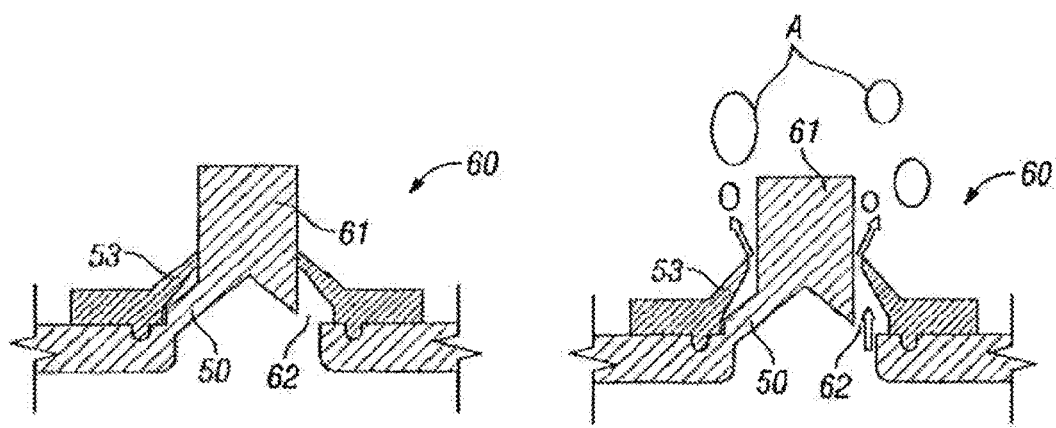
FIG. 13　　　　　FIG. 14

DISPENSER AND REFILL UNIT AND DISPENSING METHODS

This is an application filed under 35 USC 371 of PCT/GB2013/050272, which in turn claims priority from GB 1202578.9 filed 15 Feb. 2012, the entire contents of the foregoing applications being incorporated by reference to herein.

The present invention relates to a dispenser for dispensing a liquid, such as liquid soaps useful in hand washing as well as light duty dishwashing detergent soaps useful for the manual cleaning of dishware. The dispenser may also be used to dispense liquids which are useful in the cleaning of surfaces such as hard surfaces, and soft surfaces.

While light duty dishwashing soaps and liquid hand soaps are conventionally provided in deformable plastic bottles having a dispensing nozzle, or in manually pumpable dispensing devices, such are frequently inconvenient to use by a consumer or other user. Further while effective, the frequent use of the products being dispensed also typically causes the buildup of residues, dirt or stains upon the exterior of such plastic bottles or manually pumpable dispensing devices. So called "no-touch" dispensers have been introduced to dispense such products and many such devices are known to the art.

One advantageous device is a dispenser and refill unit disclosed in WO 2010/055314 (the contents of which are herein incorporated by reference.) The device has a base unit into which a refill unit containing the material to be dispensed is fitted in an inverted configuration, namely with its outlet at the lowermost end. The device is a so-called hands-free dispenser which is generally suitable for domestic use. The device is intended to be placed upon a flat, generally horizontal surface and responsive to the "breaking" of (interrupting) an infrared beam originating between an infrared transmitter proximate to the dispensing nozzle and a receiver positioned within the base of the device, which is the sole manner in which the delivered dose of the soap can be caused to occur. Although the device is well suited for the metered delivery of a dose of the soap to the hands of a user of the device which occurs when the hands (or article) are held in near proximity to the nozzle, thereby breaking the infrared beam, the device is not suited to deliver such a metered dose of the soap in any other manner.

This shortcoming in the prior art is overcome by the provision of a inclination sensor means which is responsive to the change in the position of the device, particularly an angular displacement with respect to the normal vertical positioning of the body of the device when it is placed upon a generally horizontal surface, which inclination sensor means functions to trigger the device and thus thereby deliver a dose of the liquid to be dispensed. Such an inclination sensor means is distinguished from a proximity sensor means, as it is responsive to the angular displacement of the device, irregardless of the placement of hands or any other article proximate to the device, e.g., within the infrared beam. The provision of such an inclination sensor means allows for one or more metered doses of the soap to be dispensed from the device, by merely "tilting", or alternately inclining the base of the device to a position other than the normally vertical position of the device. Ideally, and according to preferred embodiments, the inclination sensor means is responsive when the device is tilted or angularly displaced forwardly, that is to say in the direction of the dispensing nozzle part of the device, whereby the base of the device is tilted by a minimum angle "A", also referred to as a "tilt angle".

The present invention has been specifically designed for a free-standing liquid dispenser suitable for use in a domestic environment. However, it could also be applicable to a demountable or hingedly affixed wall-mounted unit which can be suitable inclined and could be useful in larger scale devices, e.g., such as devices for use in public lavatories.

According to one aspect of the present invention, a dispenser comprises a base unit with an actuation mechanism for dispensing liquid and a refill unit insertable into the base unit in an inverted configuration with its outlet lowermost for the supply of liquid to the base unit, the refill unit comprising an annular wall projecting into the refill unit and defining an outlet from the refill unit, the annular wall being closable at its innermost end by a valve element biased onto the annular wall, the base unit comprising a hollow spigot and an annular seal surrounding and spaced from the top of the spigot, whereby insertion of the refill unit into the base unit causes the spigot to enter the annular wall and to lift the valve element from the annular wall to define a flow path from the refill unit, through at least one cut-out portion formed in the top of the spigot and/or the bottom of the valve element and down the hollow spigot, and the annular seal to seal between the spigot and the annular wall. The base unit also comprises a proximity sensor means, and an inclination sensor means each of which said means may independently or jointly trigger the actuation means (or other parts of the device) causing the device to operate to deliver one or more doses of liquid from the dispenser.

Such an arrangement of a base unit and insertable refill unit provides a mechanism by which the refill unit can simply be lowered onto the spigot. This causes the flow path to be opened up. During the opening process, the annular seal forms a seal with the annular wall thereby preventing leakage even during the opening process. Thereafter doses of the liquid, e.g., liquid soap, may be delivered by actuating the dispenser via the proximity sensor means and/or the inclination sensor means, which increases the utility of the dispenser allowing it to dispense the liquid when it is either in a stationary, vertical orientation as well as when the dispenser is moved to an inclined orientation or position.

In a further aspect, the present invention further provides at least two different methods of dispensing a liquid from the dispenser, the first method being based upon the proximity of a solid article, such as a hand, sponge, washcloth, etc. to the base unit, the second being based upon the relative inclination of the base unit of the dispenser to the horizontal.

These and further aspects of the invention are disclosed hereinafter.

FIG. 12 is a view similar to FIG. 11 showing the assembled cap;

FIG. 13 is a cross-sectional view through the pressure relief valve of the second example;

FIG. 14 is a view similar to FIG. 13 showing the pressure relief valve in an open configuration to allow the flow of air;

Figure 1:
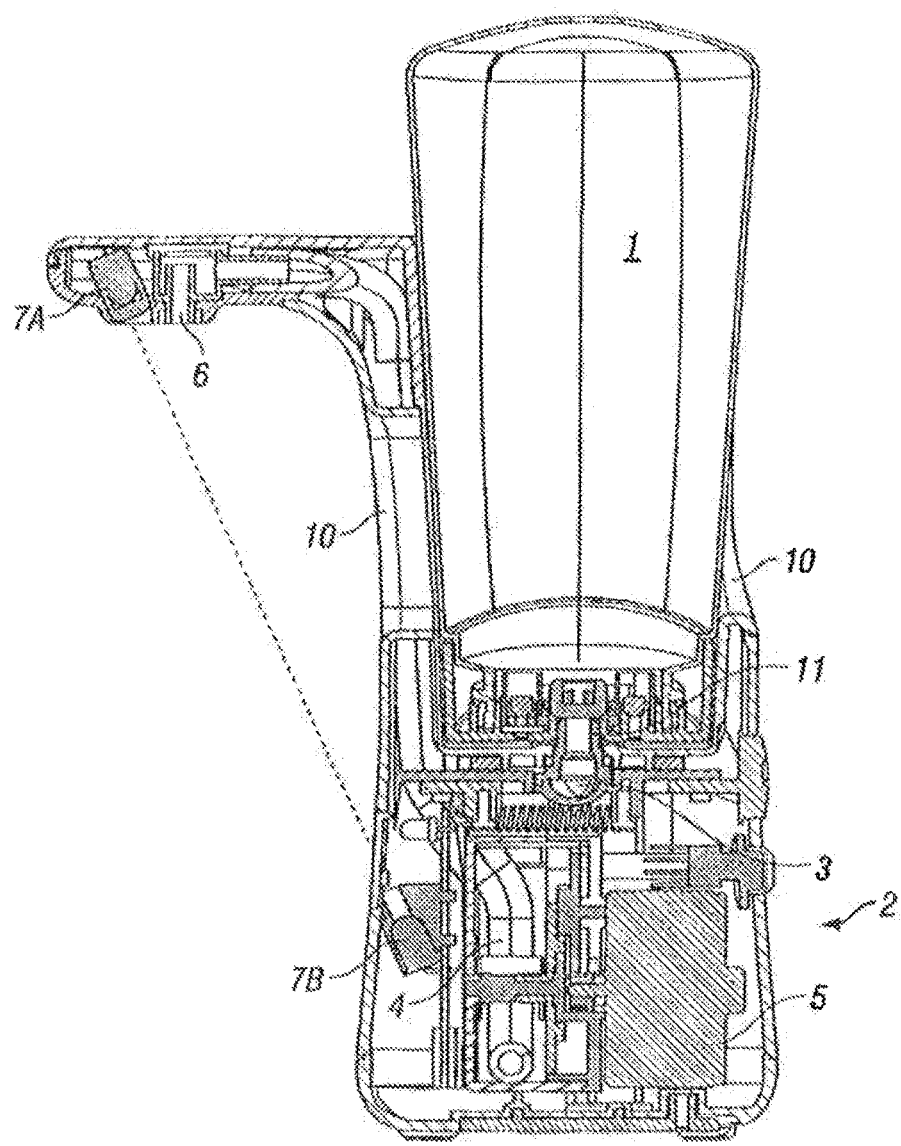
FIG. 1 is a cross-section through a dispenser.

In its most preferred embodiment, the dispenser is a hands-free dispenser which is generally suitable for domestic use. The dispenser is primarily intended to dispense liquid soap, but may also be used to dispense other liquid or semi-liquid products (ideally with a viscosity greater than water), such as hand cream, body lotion, moisturiser, face cream, shampoo, shower gel, foaming hand wash, shaving cream, washing up liquid, toothpaste, acne treatment cream, a surface cleaner or a sanitising agent such as alcohol gel. As the dispenser comprises both a proximity sensor means and an inclination sensor means, each of which said means may independently or jointly trigger the actuation means (or other parts of the device) causing the device to operate to deliver one or more doses of soap from the dispenser, the dispenser may be used to dispense a quantity of liquid soap, preferably one or more metered doses of liquid soap, responsive to either of these aforesaid means.

The dispenser comprises two main parts, namely a refill 1 and a base unit 2. The refill 1 provides a reservoir of liquid to be dispensed and is fitted to the base unit 2 as set out below.

The base has an interface 3 into which liquid is dispensed from the refill unit. The interface 3 is in fluid communication with a dispensing tube 4. A pump 5 is selectively operable to pump a metered dose of the liquid along dispensing tube 4 and out of dispensing head 6.

In a preferred embodiment, the base has an infrared transmitter 7A which transmits an infrared beam through a window 8 to a receiver 7B to sense the presence of a user's hands or other article (e.g., a sponge, washcloth, paper towel, wipe article such as woven or nonwoven wipe, abrasive pad or tablet) in the vicinity of the dispenser. Such is a preferred embodiment of a proximity sensor means. Control circuitry reacts to a signal from the proximity sensor means in order to activate the pump, and thereby deliver a quantity of the liquid soap the of the nozzle 6. The illustrated sensor is a break beam sensor, but may also be a reflective sensor. Although an infrared sensor is shown, any known proximity sensor such as a capacitive sensor may be used. The base also includes an inclination sensor means 100. The inclination sensor means 100 is responsive to at least the displacement of the dispenser from the vertical orientation which it normally assumes when the base unit 2 is placed upon a generally horizontal surface, as is depicted in FIG. 1. In a preferred embodiment, the inclination sensor means 100 is responsive to the "tilting" of the device from the generally vertical orientation, to an inclination in the direction of the nozzle 6. Most advantageously, the inclination sensor means remains unresponsive, until a minimum inclination angle "A" is reached, and only thereafter, does the inclination sensor means operate to send a signal to the control circuitry which reacts and activates the pump, thereby dispensing the liquid soap via the nozzle. In FIG. 1, the inclination sensor means is not visible, as it is obscured by the receiver 7B, but a preferred embodiment of the inclination sensor means is disclosed in one or more of the figures. In the preferred embodiment depicted, the inclination sensor means is a generally tubular cavity which contains within the cavity a movable conductive element, such as a metallic ball and further, the inclination sensor means includes one or more signal carriers (e.g., wires) which may be used to transmit a suitable signal which can be used to initiate or halt the operation of the pump. Generally, the signal carriers are attached to a control means which processes the signal, thereafter transmits a further suitable signal in order to cause the activation of the pump, which in turn causes dispensing of the quantity of the liquid soap via the nozzle 6. The generally tubular cavity also defines a central axis of the inclination sensor means 100 along which axis the movable conductive element transits. Preferably, the orientation of the central axis is disposed with respect to the dispenser or base unit 2 at an angle other then the horizontal. The dispenser is activated when the dispenser or the base unit 2 is inclined away from the vertical so that the central axis of the tubular cavity becomes at least horizontal, which causes the conductive element to transit to one end of the inclination sensor means, and cause the closure of an electrical circuit which operates as a signal to the control circuitry and/or pump, thereby causing the pump to operate.

Other devices may be provided as inclination sensor means, including but not limited to: micro electro-mechanical systems (MEMS)-based accelerometer, tilt sensor, gyroscope, magnetometer, inertial sensors, momentum actuated switches, mercury level switches, or other sensors capable of detecting angular momentum or orientation, viz., the tilt angle "A", of the dispenser or the base unit 2.

The device may be mains powered or battery powered.

The interface between the refill 1 and base unit 2 will now be described in greater detail with reference to FIGS. 2 to 10.

The base unit 2 comprises a cowling 10 which forms a cup-shaped housing surrounding a significant portion of the refill to protect and support it. A spigot 11 projects through the base of the cowling 10 and is sealed to the cowling 10 by an O-ring seal 12. The spigot has a plurality of castellations 13 in its top surface. A second O-ring seal 14 surrounds the spigot 11 beneath the castellations 13.

The refill 1 comprises a bottle 20 to which a cap 21 is fixed. The bottle 20 has a neck 22 which fits over and seals with an annular flange 23 within the cap 21. The cap 21 has an upwardly depending skirt 24 (when in the inverted orientation shown in the drawings) which forms the outer surface of the cap. Working inwardly from the skirt 24, the next feature of the cap is an outer annular wall 25 which is generally co-axial with the skirt 24.

This is shown in detail in FIGS. 5 to 10.

Figure 2:
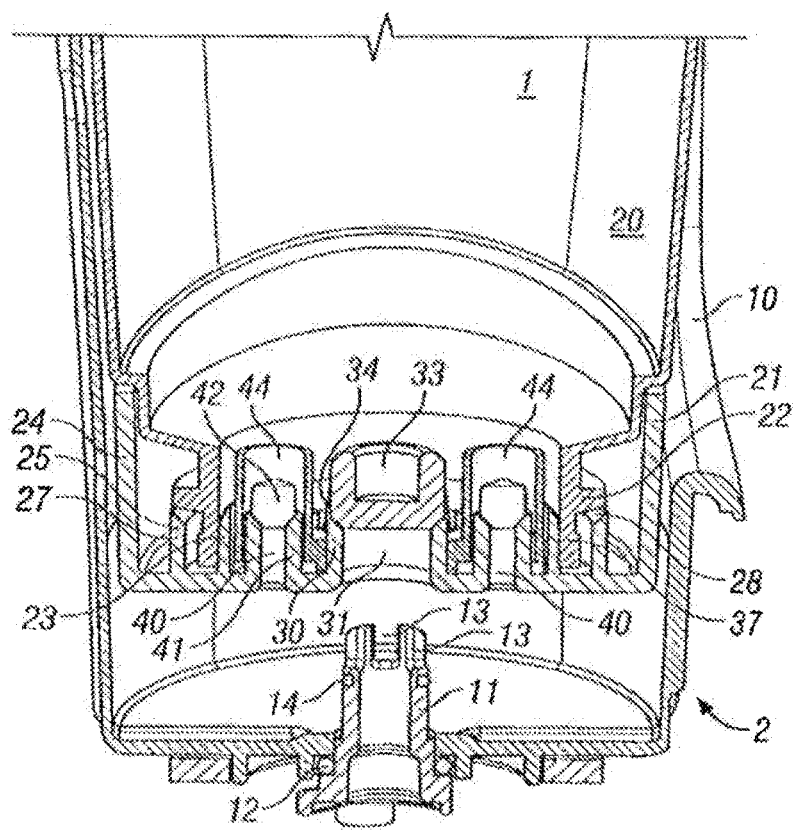
FIG. 2 is a cut-away perspective view of the refill being introduced into the dispenser but not yet being engaged.
Figure 5:
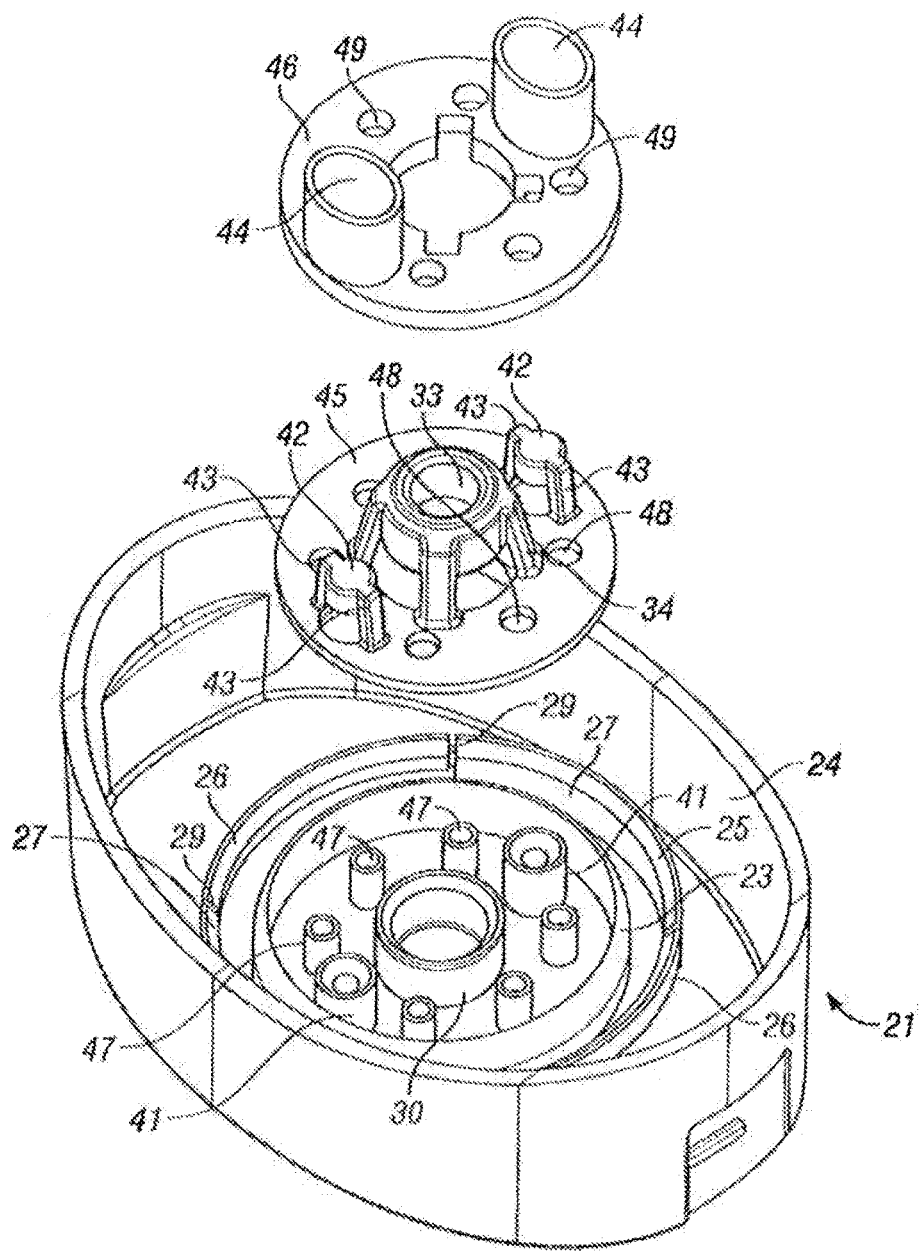
FIG. 5 is a perspective view of the cap assembly prior to assembly.
Figure 6:
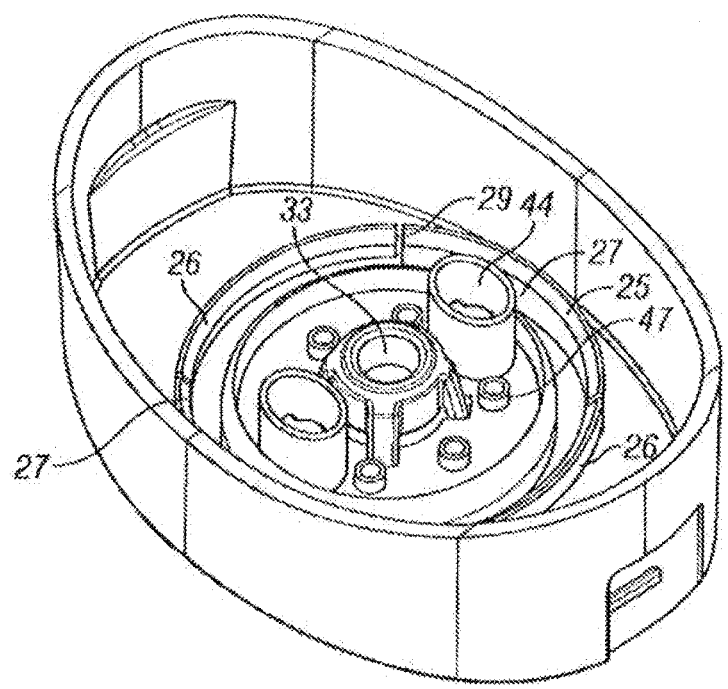
FIG. 6 is a perspective view of the cap assembly after assembly.
Figure 7:
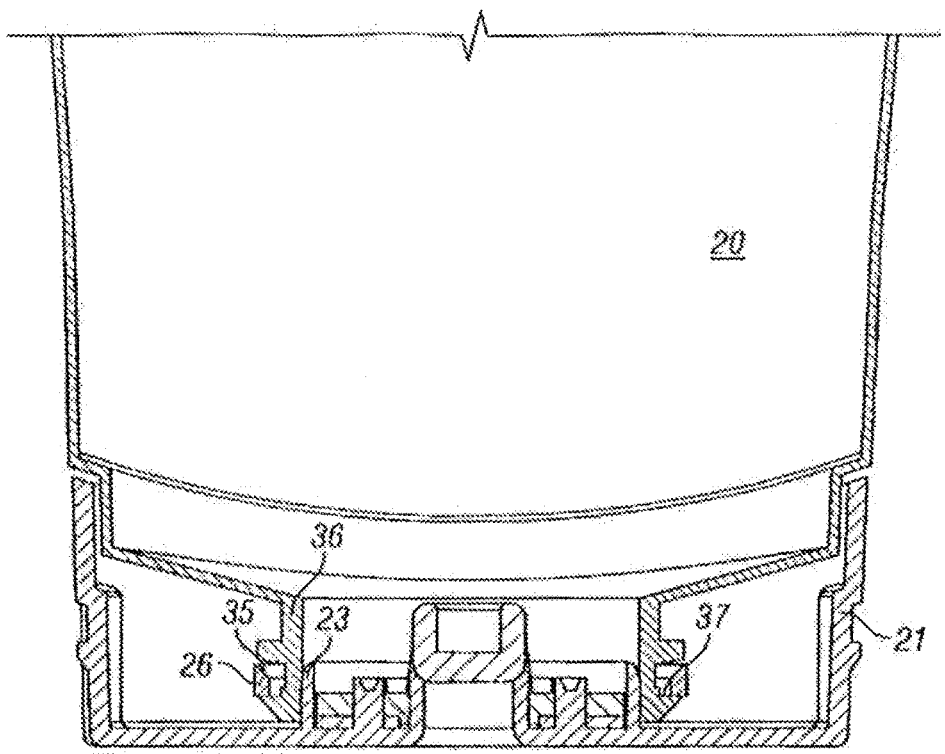
FIG. 7 is a cross-section showing the engagement between the bottle neck and cap assembly.
Figure 8:
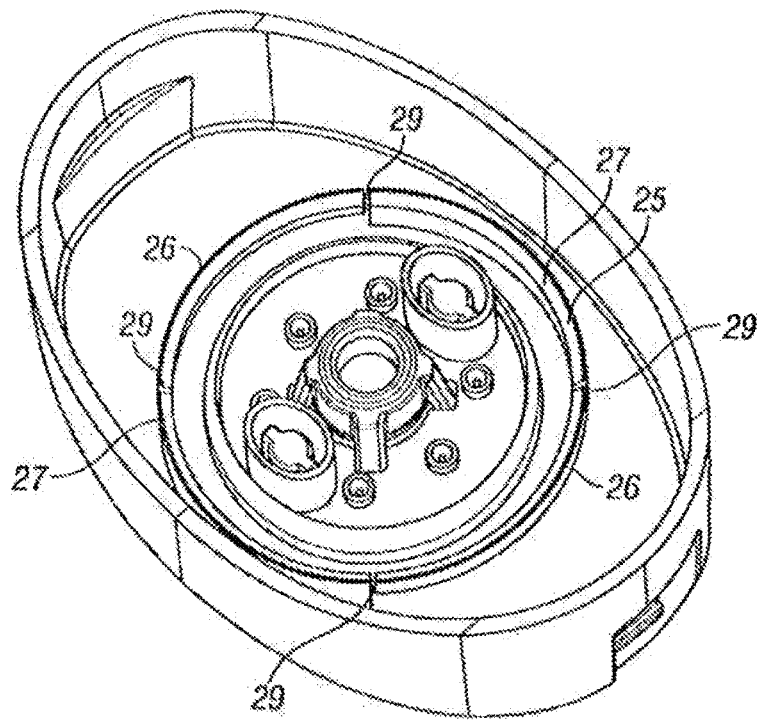
FIG. 8 is a perspective view of the cap with the frangible members intact.
Figure 9:
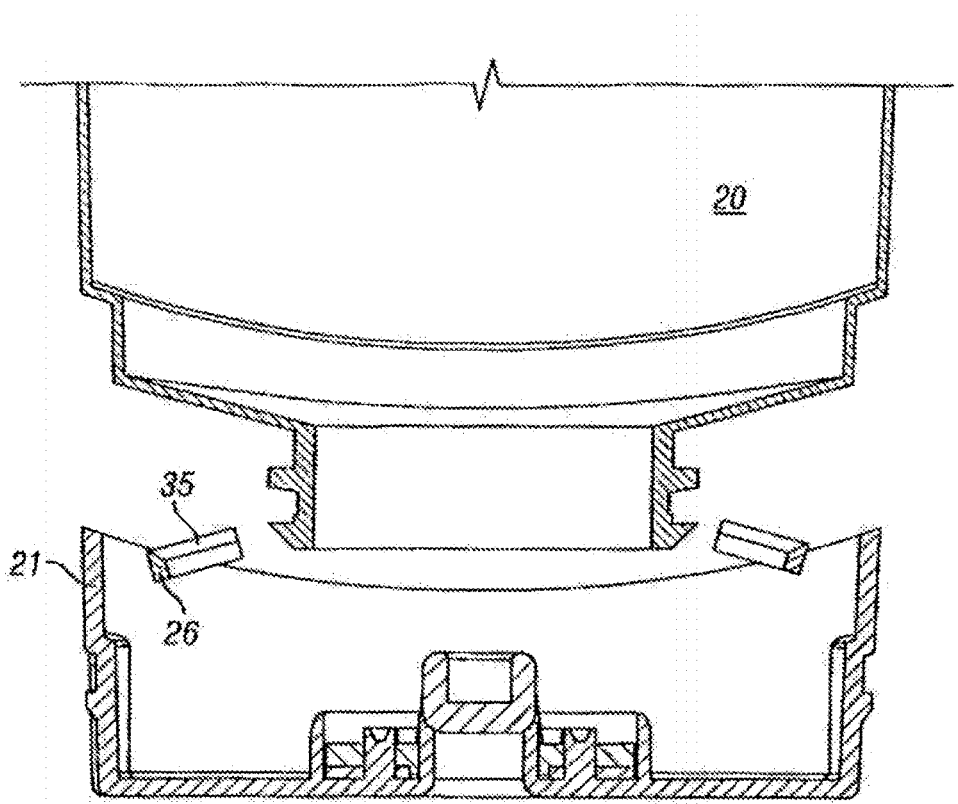
FIG. 9 is a view similar to FIG. 7 after the bottle has been removed from the cap.

The outer annular wall 25 consists of a pair of retaining members 26 and a pair of support members 27 which alternate with one another and each extend for approximately a quarter of the circle as shown in FIGS. 5, 6, 8 and 10. The profile of the support members 27 is as shown in FIG. 2. These members extend directly up from the lower wall of the cap, are parallel sided and have an inclined upper surface 28. The profile of the retaining members 26 is shown in FIGS. 7 and 9. Unlike the support members 27, these are not fixed to the wall of the cap. Instead, they are fixed at either end to the support members 27 by frangible members 29 as best shown in FIGS. 6 and 8. The retaining members 26 are parallel sided and have an inclined upper surface 35 as shown in FIGS. 7 and 9.

As shown in FIGS. 7 and 9, the neck 22 of the bottle has an inclined outer surface 36 which is complimentary to the inclined surfaces 28 and 35 of the annular wall 25. Behind the inclined outer surface 36 is a shoulder 37 which faces the main body of the bottle 20. This inclined outer surface 36 and shoulder 37 is only present in the vicinity of the retaining members 26 and not in the vicinity of the support members 27. Adjacent to the support members 27, the neck 22 has a parallel sided configuration as shown in FIG. 2.

Figure 10:
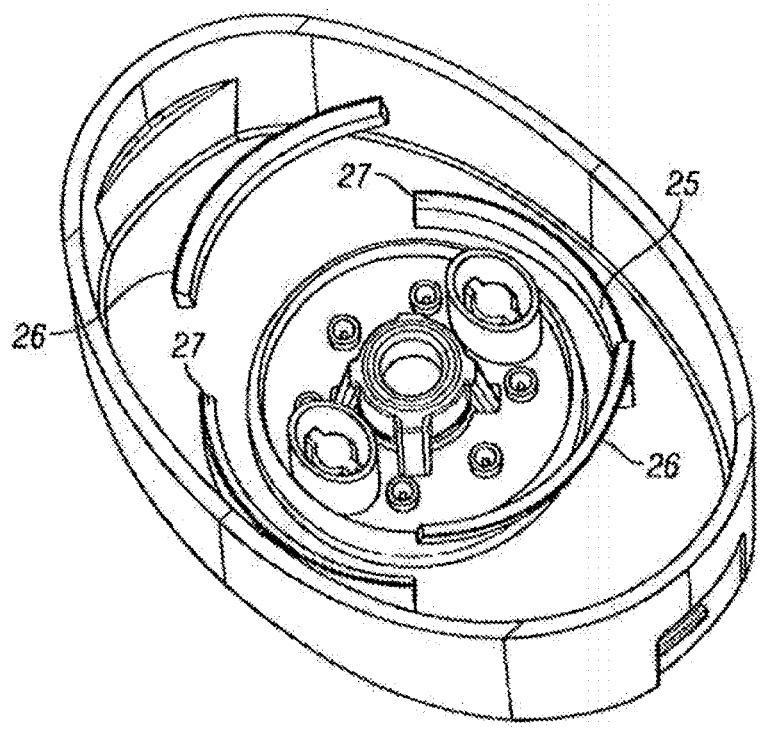
FIG. 10 is a view similar to FIG. 8 after the frangible members have broken off.

In order to insert the bottle 20 into the cap 21, the bottle 20 is pushed down with its neck fitting over the annular flange 23. The inclined outer surface 36 of the bottle co-operates with the inclined surfaces 28, 35 to displace the retaining members 26 radially outwardly until the shoulder 37 snaps into place behind the retaining members 26 as shown in FIG. 7. When the bottle 20 is pulled off of the cap 21, the shoulders 37 bear against the retaining members 26, thereby breaking frangible members 29 so that the retaining members 26 become detached from the cap 21 as shown in FIGS. 9 and 10. Once this has happened, it is no longer possible to retain the cap on a bottle, thereby preventing subsequent use of the refill 1.

It should be noted that it is not necessary for both of the retaining members 26 to become fully detached from the lid. It is possible that only one of these becomes detached, or that one or both are simply displaced to a location at which they can no longer engage with the neck of the bottle.

Returning now to FIGS. 2 to 4, the liquid outlet and associated valve will now be described.

The liquid outlet from the reservoir is provided by an annular wall 30 surrounding a central opening 31. At the top of the annular wall 30 is an inclined surface 32 (see FIG. 4) which provides a valve seat for outlet valve element 33. This is shown in the form of a U-shape cup-like member, but may equally be a solid member or a hollow ball-like member. The outlet valve element 33 is biased into its closed position by a plurality of biasing elements 34.

These are attached at their upper end towards the top of the valve element 33 and are attached at their lower ends at a location radially outward of the annular wall 30 and below the top of the annular wall 30. They are preferably formed integrally with the valve element 33.

Figure 3:
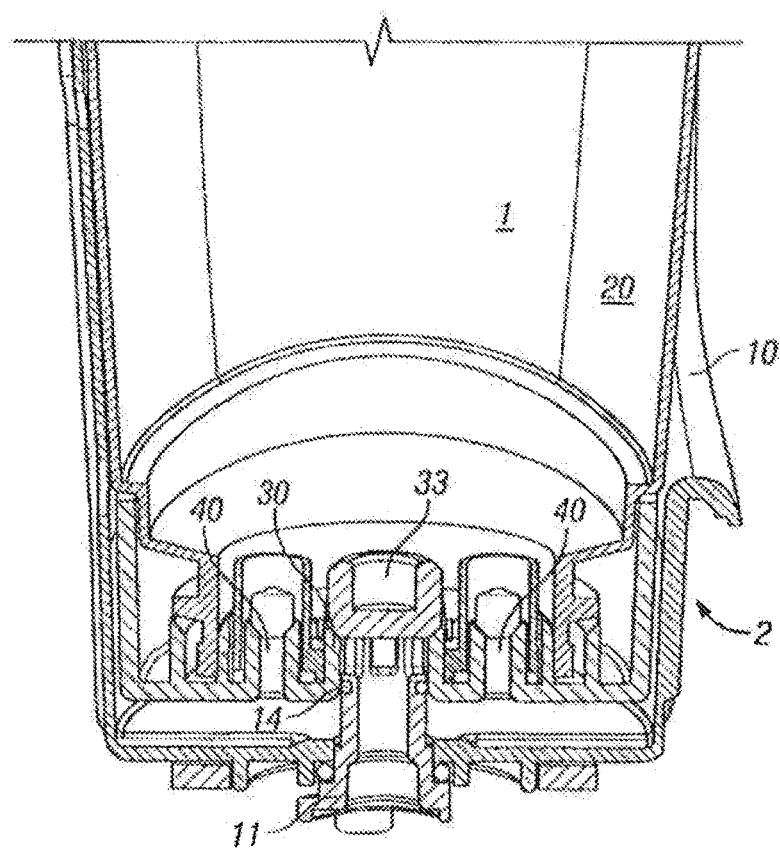
FIG. 3 is a view similar to FIG. 2 showing the refill in an intermediate position.
Figure 4:
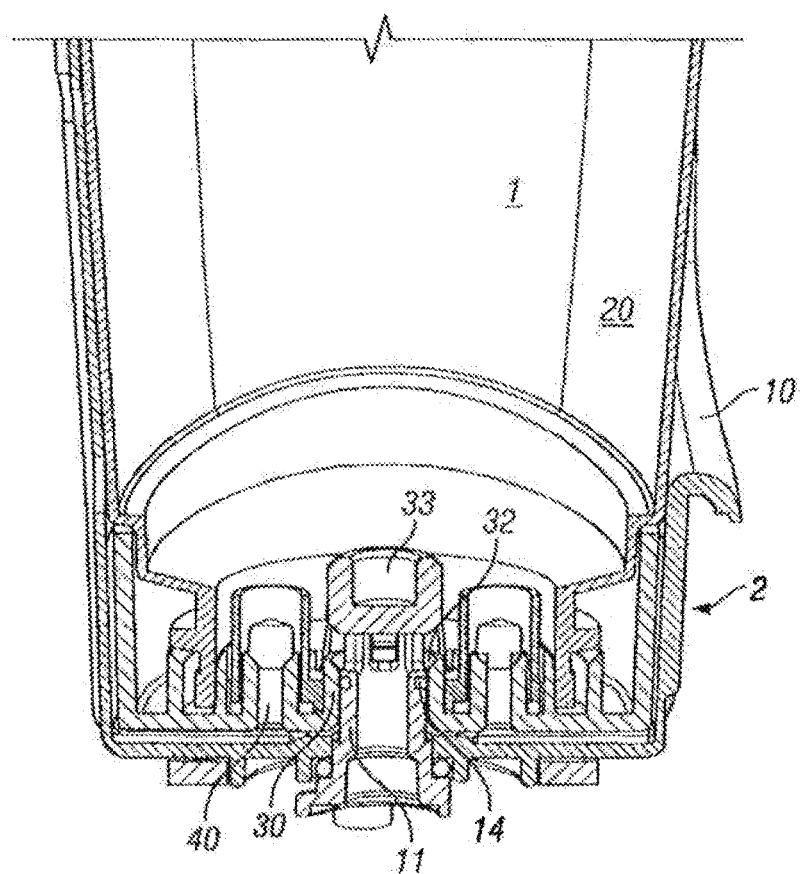
FIG. 4 is a view similar to FIGS. 3 and 4 showing the refill in its fully engaged position.

As shown in FIGS. 2 to 4, when the refill 1 is lowered into the base unit 2, the spigot 11 engages with the lower surface of the valve element 33 as shown in FIG. 3. Further downward movement of the refill causes the valve element 33 to be lifted from its seat, and also brings the O-ring 14 into sealing engagement with the annular wall 30. The valve element 33 is lifted to the position shown in FIG. 4. In this position, liquid in the bottle 20 can flow around the biasing elements 34, and enter the spigot via the castellations 13 and hence flow into the base unit 2. Liquid is prevented from escaping between the spigot 11 and annular wall 30 by the O-ring seal 14. This arrangement offers a simple and mess-free way for a consumer to insert a refill regardless of the fill level of the refill.

In order to remove a refill, the consumer lifts it out of the base whereupon the biasing elements 34 cause the valve element 33 to return to the seat 32. During this movement, the seal between the spigot 11 and annular wall 30 is maintained by the O-ring seal 14. A spent refill is then replaced by a new one following the above procedure.

The cap is provided with a pair of pressure relief valves 40. Each is formed by an annular boss 41 integral with the cap 21. A pressure relief valve element 42 is seated on the top of the annular boss 41 and is biased in place by a pair of biasing elements 43 (as shown, for example, in FIG. 5). The biasing force is such that, under normal conditions, the pressure relief valve element 42 forms an air tight seal on the boss 41. However, when the pressure within the bottle 20 drops below a certain level, the pressure differential across the relief valve element 42 is sufficient to overcome the force exerted by biasing elements 43 and to allow air into the bottle 20. This reduces the pressure differential thereby restoring the air tight seal without leakage of fluid.

Each pressure relief valve 40 is surrounded by an annular barrier 44 which extends axially to a level axially above the level of the top of the annular wall 30. Thus, when the valve element 33 is open, any air entering the relief valve 40 will not become entrained in the outgoing liquid stream. In practice, this means that the relief valve can be placed closer to the outlet, thereby resulting in a more compact cap. Although two relief valves are shown, a single valve, or more than two valves could be provided if necessary.

The manner in which the cap is assembled is illustrated in FIGS. 5 and 6.

The assembly is a three-part structure consisting of the cap 21, a valve plate 45 and a fixing plate 46. The cap has a number of moulded features including the annular flange 23, annular wall 25 and annular bosses 41. In addition, the cap 21 has a plurality of fixing posts 47.

The valve plate 45 is an elastomeric material and is integrally formed with the valve element 33, biasing elements 34, relief valve element 42 and biasing elements 43. The valve plate has a plurality of locating holes 48 which correspond to the fixing posts 47.

The fixing plate 46 is made of a rigid plastics material and is integrally formed with the annular barrier 44. As with the valve plate 45, the fixing plate 46 is also provided with a plurality of locating holes 49 which correspond to the fixing posts 47.

To assemble the cap, the three components are placed on top of one another as shown in FIG. 6 with the fixing posts entering the locating holes to ensure that the components are correctly aligned. Heat or adhesive is then applied to the top of the fixing posts 47 to secure the fixing posts to the fixing plate 46. The elastomeric valve plate 45 is thereby sandwiched between the cap 21 and fixing plate 46 which holds the valve elements 33 and 42 in position.

A second example of a cap for a refill unit will now be described with reference to FIGS. 11 to 14.

The structure of the outlet valve element 33 in the second example is essentially the same as the first example, and will not be described again in relation to the second example.

Figure 11:
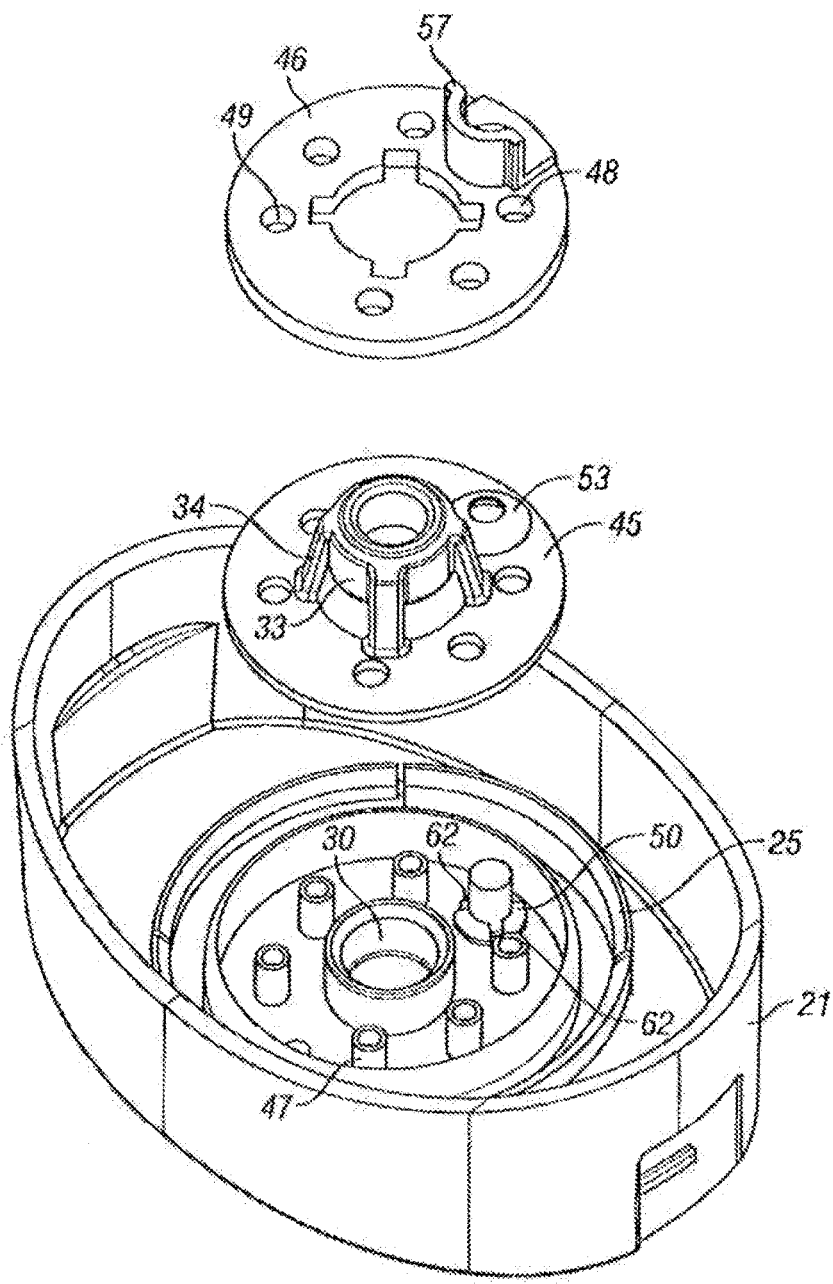
FIG. 11 is an exploded perspective view of a cap of a second refill unit.

As can be seen from FIG. 11, the cap 21 is integrally molded with a number of features, such as the annular walls 25 and 30 and a conical part 50 of the pressure relief valve which will be described below. A resilient lip 53 (described in more detail below) for the pressure relief valve is provided integrally molded with the valve plate 45. The fixing plate 46 is also provided with a shield 57 for the relief valve. This is equivalent to the barrier 44 in FIG. 2, but only extends around the side of the relief valve facing the outlet valve element 33. The barrier 44 and shield 57 could be used interchangeably in the two examples.

The cap assembly is assembled in the same manner as in the first example.

The pressure relief valve 60 is illustrated in FIGS. 13 and 14.

The valve has the conical part 50 which is an integral part of the cap 21 as mentioned above. At the top of the conical part 50 is a cylindrical post 61. The resilient lip 53 is effectively a hollow frustoconical extension of the valve plate 52 of resilient material which extends along the conical part 50 from which it diverges slightly and is a tight fit against the post 61. At least one air inlet 62 (also shown in FIG. 11) passes through the wall of the conical part 50 and is normally covered by the resilient lip 53 as shown in FIG. 11. When the pressure in the bottle 20 falls as liquid is emptied the pressure differential across the resilient lip 53 will eventually become sufficient to displace the lip 53 to a sufficient degree to allow air A into the bottle 20 as shown by the arrows in FIG. 8. It should be noted that the degree to which the resilient lip 53 lifts from the conical element 50 has been exaggerated in FIG. 8 and that, in practice, this will be almost imperceptible.

Instead of sealing against the post, the resilient lip 53 may seal against the conical part 50. In this case, the lip will not diverge from the conical part as shown. Instead, it would actually have an angle of incline less than the angle of the conical part 50 so as to be naturally biased onto the conical part.

An example of a third refill unit will now be described with reference to FIGS. 15 to 18. This is the same in most respects as the first example, and only the significant differences are described here.

Figure 15:
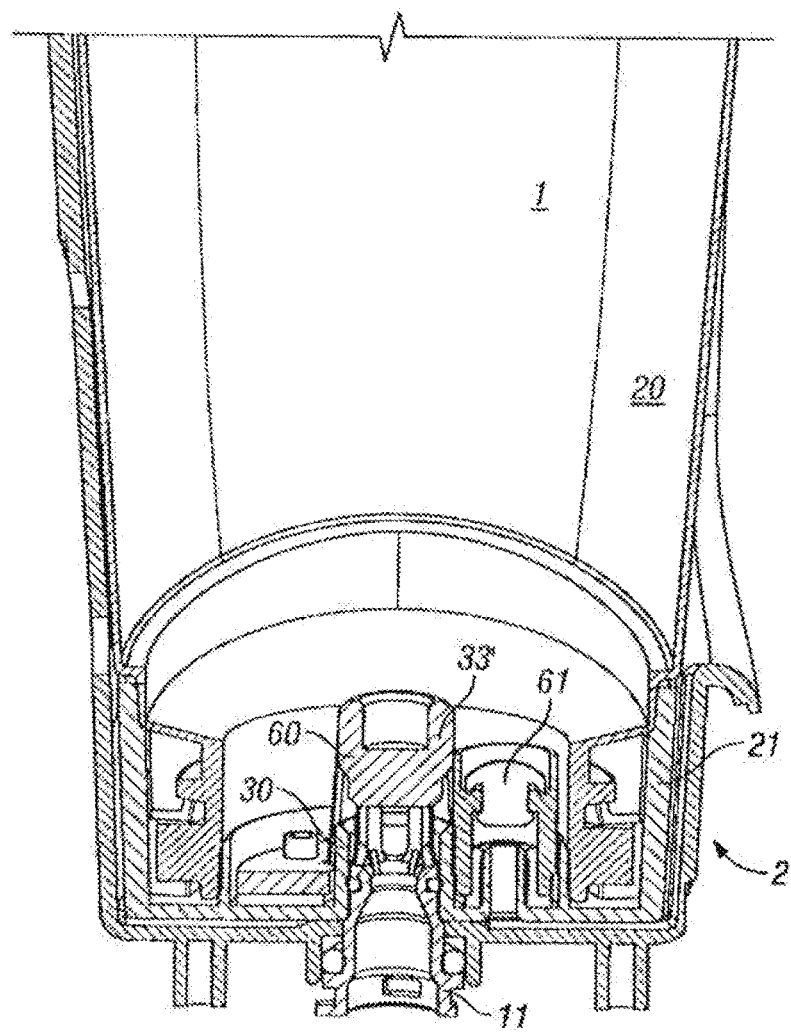
FIG. 15 is a view similar to FIG. 4 showing a third refill unit on the dispenser.

As can be seen in FIG. 15, the outlet valve element 33' is shaped differently. In this case, there is a reduced diameter portion 60 which fits within the annular wall 30 when the valve is closed to assist the sealing to the annular wall.

The pair of pressure relief valves 40 have been replaced by a single conventional umbrella valve 61.

Figure 16:
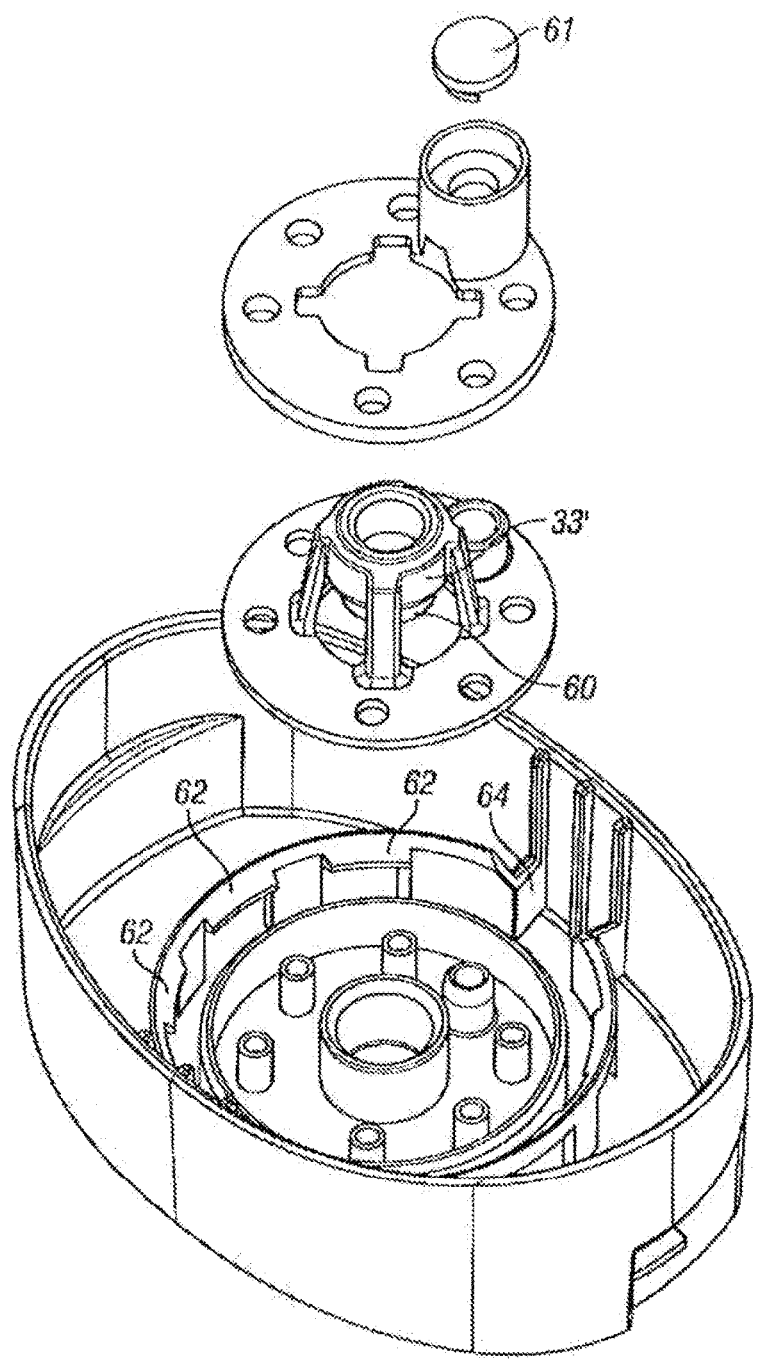
FIG. 16 is a view similar to FIG. 5 of the cap of the third refill unit.
Figure 17:
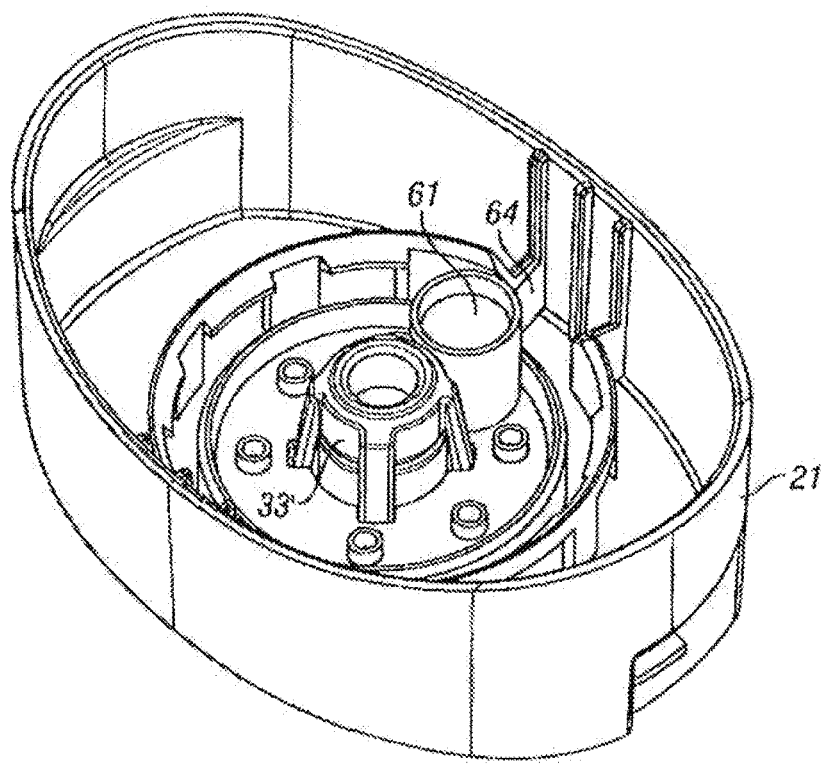
FIG. 17 is a view similar to FIG. β showing the cap of the third refill unit assembled.
Figure 18:
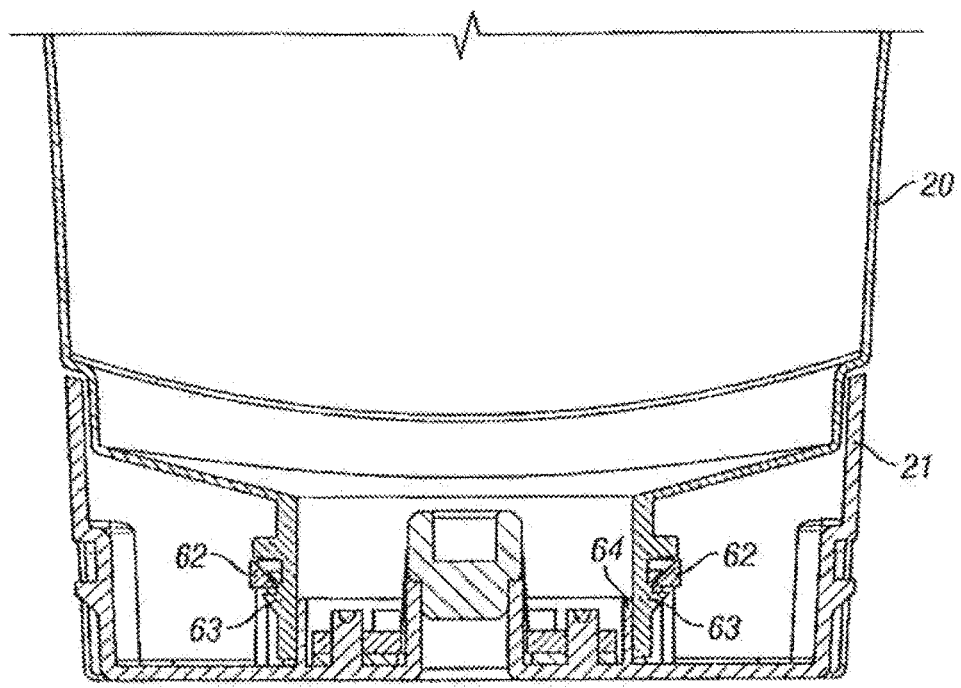
FIG. 18 is a view similar to FIG. 7 of the third refill unit.

The retaining members 26 with their frangible members 29 have been replaced by a plurality of intermittent shoulders 62 which, as shown in FIG. 18 engage with complementary shoulders 63 on the neck of the bottle 20. Inward deflection of the neck of the bottle is prevented by a flange 64. Once in the FIG. 18 position, the engagement between the shoulders is strong enough to prevent the cap from being removed from the bottle for all practical purposes. This is facilitated by a keying arrangement 64 on the cap as shown in FIGS. 16 and 17 which engages with a complementary protrusion on the bottle (not shown) to prevent relative rotation between the cap 21 and bottle 20.

A preferred embodiment of an inclination sensor means, as well as the overall operation of inclination sensor means with respect to the position of the dispenser is discussed with reference to the following figures.

Figure 19:
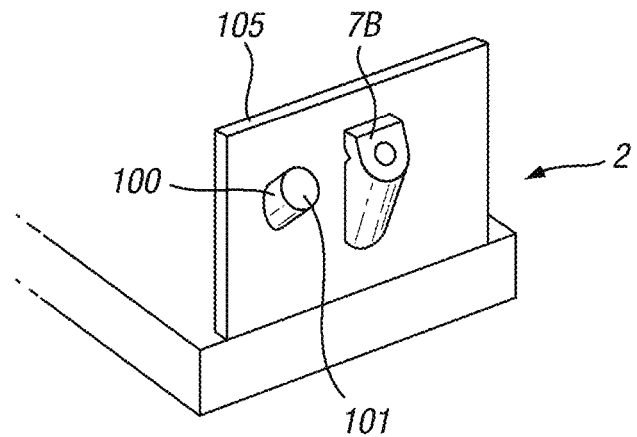
FIG. 19 is a view of a part of the interior of the base unit of FIG. 1.

FIG. 19 illustrates in relevant part a perspective view of a part of the interior of the base unit 2 of FIG. 1, here taken from the opposite side of the view presented in FIG. 1 and showing in relevant part and in more detail a preferred embodiment of the inclination sensor means 100. As is visible from FIG. 20, the inclination sensor means 100 comprises a generally tubular cavity which contains within the cavity a movable conductive element, namely a metallic ball. The metallic ball may freely move within the cavity between the two ends 101, 102 and further, the inclination sensor means includes one or more signal carriers (e.g., wires) (not shown) which may be used to transmit a suitable signal which can be used to initiate or halt the operation of the pump (not shown). The sidewall 103 of the inclination sensor means 100 is generally tubular in shape, and a central axis or center line "C" may defined. Within the interior of the cavity, the metallic ball may freely move between the two ends 101, 102, so that when the base unit 2 is moved from the generally vertical orientation a shown in FIG. 1 and in FIGS. 19, 20 and inclined, the metallic ball may move to an end of the inclination sensor means 100. As more specifically shown in FIG. 20, the base unit 2 is placed upon a generally horizontal planar surface, "H", which can be used to define the respective or relative orientation of the base unit 2 and any or all parts thereof. Furthermore, a degree of inclination can also be defined with respect to the generally horizontal planar surface "H", and the position of the base unit 2 as shown, is understood to be in a generally vertical orientation. As is further visible in FIG. 19 as well as in the next FIG. 20, the inclination sensor means 100 is mounted upon or through, here extending through a vertical mounting plate 105 which is generally perpendicular to the horizontal, and the center line or axis "C" of the inclination sensor means 100 is angled by an angle "B" with respect to the horizontal "H". Advantageously, the angle "B" is between 2 and 89 degrees of arc, but preferably is between 5-75 degrees of arc, especially preferably between 5-45 degrees of arc. In the embodiment depicted on FIG. 20, the angle B is approximately 20° of arc. Thus, in the position depicted on FIG. 20, the ball contained within the cavity of the inclination sensor means 100 under the force of gravity rests against the end 102. When the base unit 2 is inclined in a forward direction, (represented by the arrow "F") viz, in the direction of the nozzle with respect to the balance of the base unit 2, and the base unit 2 is tilted in such a direction, by a sufficient degree of offset with respect to the horizontal, the ball may freely move to the opposite end 101 and (although not shown) come into contact with one or more suitable pads or wires, thereby closing an electrical circuit or otherwise transmitting a suitable signal to the pump or controller means of the dispenser (not shown in this figure). This is better understood with reference to the following FIG. 21.

Figure 20:
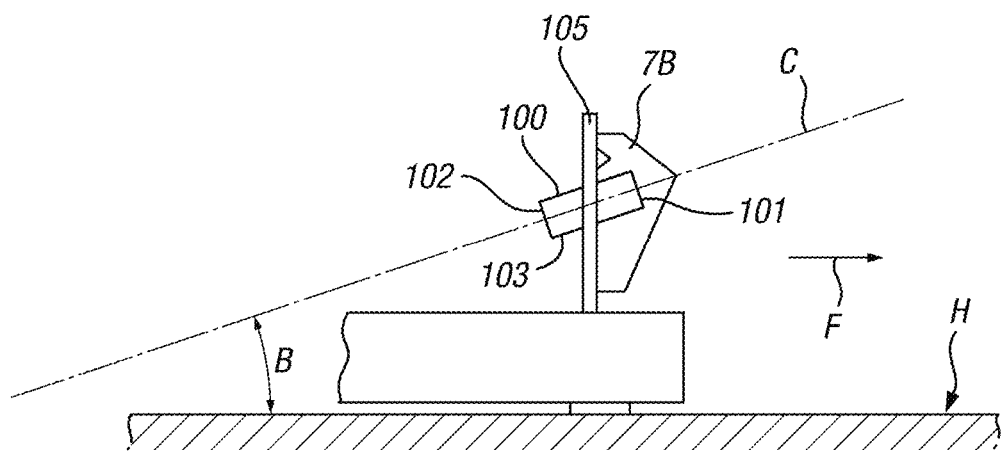
FIG. 20 is an elevational view of a part of the interior of the base unit of FIG. 1.
Figure 21:
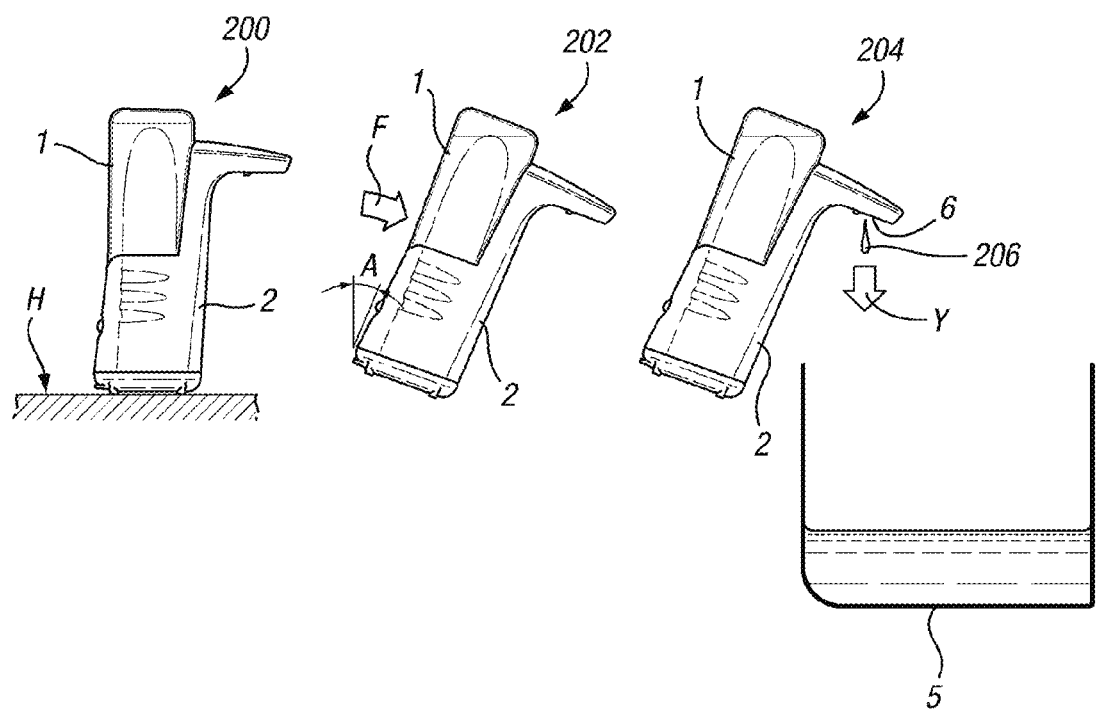
FIG. 21 depicts the mode of dispensing liquid from the dispenser which utilizes the inclination sensor means.

Depicted on FIG. 21 is a dispenser according to the invention, and relevant in particular to the embodiments according to FIGS. 19 and 20 in three different relative positions of inclination. In the first position 200, the base unit 2 rests atop a generally planar horizontal surface H such that the base unit 2 and the dispenser are considered to be in a generally vertical orientation. If desired by the user, the proximity sensor can be used to dispense a quantity of the liquid soap contained within the refill unit 1 in the manner described previously. In the second position 202, the base unit 2 has been lifted and separated from the generally planar horizontal surface H and is inclined forwardly (in the direction of arrow 'F') by an angle "A". In the third position 204, which corresponds to the second position 202, the base unit 2 is inclined by at least the angle A, which is to be understood as to be a sufficient angle in order to cause the operation of the inclination sensor means (not shown) which in turn activates the control circuit and/or pump, thereby causing a dose 206 of the liquid soap to be dispensed from the nozzle 6 of the dispenser. In preferred embodiments and with reference to FIGS. 20 and 21, the angles A=B, but preferably A≥B. In such an inclined orientation the dispenser is caused or operates to deliver a metered dose of the liquid soap 6 directly into the interior of a suitable basin, or sink "S", and no activity or function of the proximity sensor is required. In such a manner, a user may conveniently lift the dispenser from a storage a resting position, such as 200 in FIG. 21, and without engaging or operating the proximity sensor, tilt it forwardly to cause the device to dispense one or more metered doses of liquid to a sink, basin, or other receptacle which advantageously contains a quantity of water and/or dishware.

While the inclination sensor means 100 is illustrated as being mounted on a vertical mounting plate 105, such is to be understood as being merely an illustrative embodiment and not to limit the scope of the invention. The inclination sensor means 100, or for that matter any other device which may function as an inclination sensor means may be mounted or affixed to any part of the base unit 2 in any suitable manner. The inclusion of a mounting plate 105 is not required, although such provides a convenient support for mounting of the inclination sensor means 100 and the receiver 7B as depicted.

The liquid to be dispensed from the dispenser may virtually any liquid which may be used in a cleaning, disinfecting or sanitizing treatment or processes. The liquid supplied by the dispenser may be used directly without further dilution, or may be diluted to form a working treatment composition, e.g., by diluting or dispersing a quantity of the liquid in a larger volume of a solvent or water, which is thereafter used. The liquid may be used to treat inanimate surfaces including hard surfaces as well as soft surfaces. Non-limiting examples of hard surfaces are generally non-porous materials such as surfaces composed of refractory materials such as: glazed and unglazed tile, brick, porcelain, ceramics as well as stone including marble, granite, and other stones surfaces; glass, metals, plastics e.g. polyester, vinyl, fiberglass, Formica®, Corian® and other hard surfaces known to the industry. Non-limiting examples of soft surfaces include generally porous materials such as carpets, rugs, upholstery, curtains and drapes, fabrics, textiles, garments, and the like. The liquid may also be used in topical applications, such as skin sanitization, handwash, bodywash and hair washing applications. The liquid or a working treatment composition may be applied directly or with the use of an ancillary article, such as a sponge, washcloth, paper towel, wipe article such as woven or nonwoven wipe, microfiber cloth, tissue or other fibrous substrate, or abrasive pad.

The invention claimed is:

1. A dispenser comprising a base unit with an actuation mechanism for dispensing liquid and a refill unit having an outlet at a lowermost end thereof through which is supplied a liquid from the refill unit to the base unit, the refill unit is insertable into the base unit in an inverted configuration, the refill unit comprising an annular wall projecting into the refill unit and defining an outlet from the refill unit, the annular wall being closable at an innermost end by a valve element biased onto the annular wall, the base unit comprising a hollow spigot and an annular seal surrounding and spaced from the top of the spigot whereby insertion of the refill unit into the base unit causes the spigot to enter the annular wall and to lift the valve element from the annular wall to define a flow path from the refill unit, through at least one cut-out portion formed in the top of the spigot and/or the bottom of the valve element and down the hollow spigot, and the annular seal to seal between the spigot and the annular wall, wherein the base unit also comprises a proximity sensor means, and an inclination sensor means each of which is operable to independently or jointly trigger the actuation mechanism causing the device to operate to deliver one or more doses of liquid from the dispenser.

2. A dispenser according to claim 1, wherein the valve element is biased onto the annular wall by at least one resilient member.

3. A dispenser according to claim 2, wherein the at least one resilient member is joined at one end to the valve element and at the other end at a location radially outwardly of and below the innermost end of the annular wall, the at least one resilient member being configured so that when the valve element is lifted from the annular wall, a flow path is present between the valve element and the annular wall.

4. A dispenser according to claim 2, wherein there are a plurality of resilient elements with gaps therebetween to provide the flow path.

5. A dispenser according to claim 2, wherein the valve element is manufactured integrally with the at least one resilient member.

6. A dispenser according to claim 5, wherein the at least one resilient member extends into a surrounding valve plate which is secured to the cap of the refill unit.

7. A dispenser according to claim 6, wherein the valve plate is sandwiched between the cap and a fixing plate.

8. A dispenser according to claim 7, wherein one or more fixing posts are provided in one of the cap, the valve plate or the fixing plate.

9. A dispenser according to claim 1, wherein the refill unit is filled with the liquid having a viscosity greater than water.

* * * * *